(12) United States Patent
Sikka et al.

(10) Patent No.: US 11,410,905 B2
(45) Date of Patent: Aug. 9, 2022

(54) OPTIMIZED WEIGHT HEAT SPREADER FOR AN ELECTRONIC PACKAGE

(71) Applicant: International Business Machines Corporation, Armonk, NY (US)

(72) Inventors: Kamal K. Sikka, Poughkeepsie, NY (US); Kenneth Marston, Poughquag, NY (US); Tuhin Sinha, Oradell, NJ (US); Shidong Li, Hopewell Junction, NY (US)

(73) Assignee: International Business Machines Corporation, Armonk, NY (US)

( * ) Notice: Subject to any disclaimer, the term of this patent is extended or adjusted under 35 U.S.C. 154(b) by 350 days.

(21) Appl. No.: 16/357,053

(22) Filed: Mar. 18, 2019

(65) Prior Publication Data
US 2020/0303279 A1    Sep. 24, 2020

(51) Int. Cl.
*H01L 23/367* (2006.01)
*H01L 23/373* (2006.01)

(52) U.S. Cl.
CPC ...... *H01L 23/3675* (2013.01); *H01L 23/3736* (2013.01)

(58) Field of Classification Search
CPC .. H01L 23/3675; H01L 23/3736; H01L 23/42
USPC ...................................................... 257/712
See application file for complete search history.

(56) References Cited

U.S. PATENT DOCUMENTS

| | | | |
|---|---|---|---|
| 5,006,924 A | 4/1991 | Frankeny et al. | |
| 6,108,208 A * | 8/2000 | Tustaniwskyj | H01L 23/3736 165/121 |
| 6,288,900 B1 * | 9/2001 | Johnson | H01L 23/3128 165/185 |
| 6,504,723 B1 * | 1/2003 | Fitzgerald | H01L 23/3675 257/713 |
| 6,538,321 B2 * | 3/2003 | Huang | H01L 21/565 257/706 |
| 6,906,413 B2 * | 6/2005 | Bish | H01L 23/10 257/706 |
| 6,936,919 B2 * | 8/2005 | Chuang | H01L 23/367 257/706 |
| 7,141,454 B2 * | 11/2006 | Matayabas, Jr. | H01L 23/3121 438/127 |
| 7,362,580 B2 * | 4/2008 | Hua | H01L 23/10 257/E23.09 |
| 7,431,072 B2 | 10/2008 | Miyazaki et al. | |
| 7,439,617 B2 * | 10/2008 | Deppisch | H01L 23/42 257/707 |
| 8,395,254 B2 * | 3/2013 | Espiritu | H01L 23/4334 257/706 |

(Continued)

FOREIGN PATENT DOCUMENTS

| | | | | |
|---|---|---|---|---|
| CN | 201364894 U | | 12/2009 | |
| JP | 2001267469 A | * | 9/2001 | ............. H01L 24/33 |

OTHER PUBLICATIONS

English Translation of CN201364894U to Chen et al.

*Primary Examiner* — Duy T Nguyen
(74) *Attorney, Agent, or Firm* — L. Jeffrey Kelly; Steven Meyers; Lou Percello, Attorney, PLLC

(57) ABSTRACT

A heat spreader is disclosed with regions where material is absent to reduce the mass/weight of the heat spreader without substantially reducing the temperature of the semiconductor chip and without substantially affecting the warpage and mechanical stress/strain in the electronic package.

15 Claims, 10 Drawing Sheets

(56) References Cited

U.S. PATENT DOCUMENTS

| | | | |
|---|---|---|---|
| 8,674,499 B2* | 3/2014 | Murayama | F28F 7/00 257/712 |
| 8,810,028 B1* | 8/2014 | Zohni | H01L 23/3142 257/730 |
| 8,877,566 B2* | 11/2014 | Gaynes | H01L 23/42 438/125 |
| 8,921,994 B2* | 12/2014 | Higgins, III | H01L 24/97 257/692 |
| 9,018,667 B2 | 4/2015 | Lin et al. | |
| 9,425,114 B2* | 8/2016 | Bet-Shliemoun | H01L 24/17 |
| 9,437,515 B2* | 9/2016 | Colgan | H01L 23/373 |
| 10,541,156 B1* | 1/2020 | Interrante | H01L 21/52 |
| 2002/0135076 A1* | 9/2002 | Huang | H01L 23/3121 257/779 |
| 2004/0036162 A1* | 2/2004 | Chuang | H01L 23/4006 257/717 |
| 2004/0036172 A1* | 2/2004 | Azuma | H01L 23/4334 257/738 |
| 2004/0238944 A1* | 12/2004 | Bish | H01L 23/10 257/706 |
| 2004/0266068 A1* | 12/2004 | Matayabas, Jr. | H01L 23/3121 438/127 |
| 2005/0093135 A1* | 5/2005 | Liu | H01L 23/4334 257/707 |
| 2005/0104195 A1* | 5/2005 | Yang | H01L 23/3128 257/706 |
| 2005/0121776 A1* | 6/2005 | Deppisch | H01L 23/42 257/712 |
| 2005/0217824 A1* | 10/2005 | Sandberg | H01L 23/467 165/80.3 |
| 2005/0280142 A1* | 12/2005 | Hua | H01L 23/3736 257/707 |
| 2007/0065984 A1* | 3/2007 | Lau | H01L 21/561 257/E23.092 |
| 2007/0107872 A1* | 5/2007 | Miyazaki | H01L 23/367 165/80.3 |
| 2007/0228530 A1 | 10/2007 | Sato | |
| 2007/0235859 A1* | 10/2007 | Espiritu | H01L 23/4334 257/706 |
| 2008/0017975 A1* | 1/2008 | Deppisch | H01L 23/42 257/E21.503 |
| 2010/0032136 A1* | 2/2010 | Chen | H01L 23/467 165/80.3 |
| 2010/0193830 A1* | 8/2010 | Lin | H01L 21/486 257/99 |
| 2011/0291258 A1* | 12/2011 | Murayama | H01L 23/3675 257/712 |
| 2012/0309132 A1* | 12/2012 | Gaynes | H01L 23/42 438/122 |
| 2014/0077349 A1* | 3/2014 | Higgins, III | H01L 24/13 257/692 |
| 2014/0284040 A1* | 9/2014 | Colgan | H01L 23/373 165/185 |
| 2015/0279761 A1* | 10/2015 | Bet-Shliemoun | H01L 23/42 257/714 |
| 2015/0371917 A1* | 12/2015 | Colgan | H01L 23/367 257/712 |
| 2015/0371918 A1* | 12/2015 | Colgan | H01L 23/373 257/712 |
| 2015/0371919 A1* | 12/2015 | Colgan | H01L 23/36 257/712 |
| 2015/0371922 A1* | 12/2015 | Colgan | H05K 7/20509 257/712 |
| 2015/0373879 A1* | 12/2015 | Colgan | H01L 23/34 165/185 |
| 2015/0373880 A1* | 12/2015 | Colgan | H01L 23/367 165/185 |
| 2020/0135495 A1* | 4/2020 | Interrante | H01L 21/52 |
| 2020/0303279 A1* | 9/2020 | Sikka | H01L 23/3675 |

\* cited by examiner

OPTIMIZED WEIGHT HEAT SPREADER FOR AN ELECTRONIC PACKAGE

BACKGROUND

The present invention relates to removal of heat from electronic packages. More specifically, the invention relates to a heat spreader used to remove heat from semiconductor chips.

A typical electronic package used in server, consumer, telecommunication or other applications has a heat spreader (also known as a lid, hat, or cap) mounted to a chip and attached to the periphery of a chip carrier. An integrated pedestal may protrude from the bottom of the heat spreader towards the chip. In preferred embodiments, the pedestal has various thickness profiles to reduce the mass/weight of the heat spreader. The heat spreader including the integrated pedestal may be machined or formed. A thermal interface material (TIM) is used to fill the gap between the chip and the heat spreader.

The heat spreader is primarily used to spread the heat dissipated by the chip and increase the area from which the heat is removed from the chip, thereby reducing the chip operating temperature more effectively. The heat spreader also can stiffen the package containing the chip and reduce the warpage of the chip package.

Typically, there is a heat sink attached to the heat spreader device with another intervening TIM. By spreading the heat from the chip over a larger surface, the heat spreader enables use of a larger heat sink which further enhances heat removal.

However, heat spreaders add weight to the chip package which can be problematic for consumer electronics such as cell phones or for satellite electronics. The heat spreaders also induce stress in the circuit layers in the chip and in the interconnects between the chip and the chip carrier.

SUMMARY

Preferred embodiments of the present invention include methods for optimizing the shape of the heat spreader to reduce heat spreader weight and package stress while maintaining effective thermal dissipation from the chip. Embodiments of the invention also include structures and uses of heat spreaders that have reduced weight while maintaining high thermal dissipation capability.

In one preferred embodiment a heat spreader has a lip around the entire periphery of the heat spreader. The heat spreader has a top surface. The top surface has a central top surface that is flat, an outer top periphery, and a transition top region between the central top surface and the outer top periphery. The heat spreader also has a bottom surface. The bottom surface has a central bottom surface that is flat and above which the heat spreader has a maximum pedestal thickness, a transition bottom region where the cap thickness is thinner than the maximum cap thickness, and the lip extending down and around the periphery of the heat spreader. The lip can be mounted on substrate or carrier to create a space between the bottom surface and a carrier surface. A semiconductor chip is placed in the space created and a chip top surface of the chip is connected to the central bottom surface of the heat spreader such that heat generated by the chip is transported into the heat spreader though a thermal interface material. In preferred embodiments, the central bottom surface overlaps the chip top surface. Regions of the heat spreader have thinner material in selected regions to reduce mass/weight of the heat spreader without substantially reducing the function of the heat spreader as measured by design criteria.

DETAILED DESCRIPTION

Figure 1:
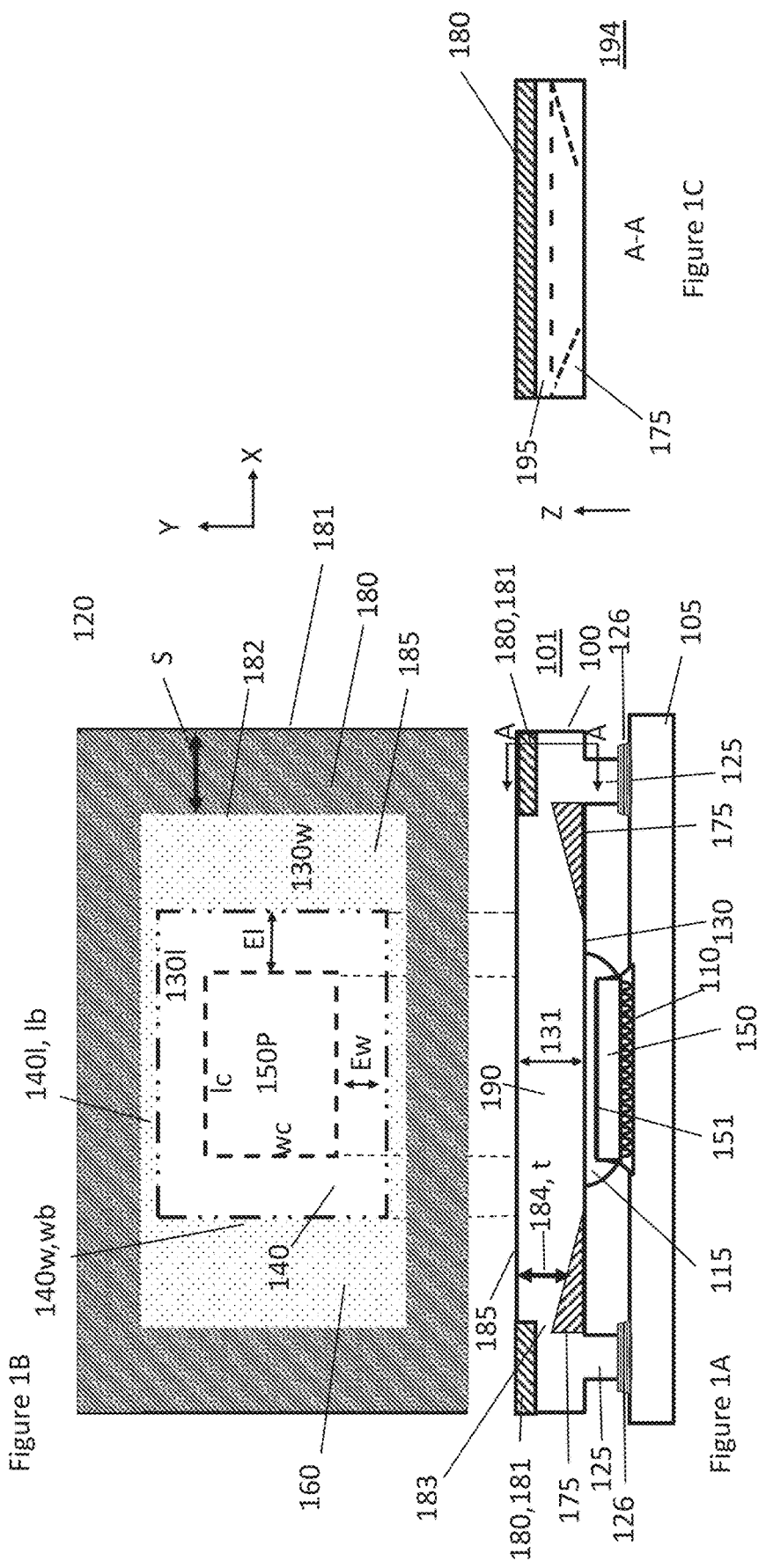
FIG. 1A is a cross section elevation view of one preferred embodiment of the present heat spreader invention.
FIG. 1B is a top view of the surface of the heat spreader in FIG. 1A showing in phantom view the chip top surface and the central bottom surface.
FIG. 1C is a side cross-section view of a preferred embodiment where a transition region of the heat spreader has thinner material.

Various optimized shapes of the heat spreaders are disclosed. Design methods are disclosed that determine places in the heat spreader structure that do not participate effectively in heat transfer. In these areas, material is thinner in the structure designs to reduce weight/mass. In various embodiments, the thickness, t, of the spreader is reduced in a transition region on the bottom surface and/or on an outer top periphery on the top surface of the heat spreader. This reduces the weight of the heat spreader without significantly affecting the heat transfer capabilities of the heat spreader. Effects of the mass reduction on other criteria also are considered in determining how much mass should be removed in different locations.

The shape of the heat spreader can be optimized for different applications. The optimized shape depends on the cooling conditions at the top of the heat spreader and the spatial power distribution in the chip.

In some embodiments, the heat spreader structures are shaped to reduce the thickness, t, at the transition bottom region on the bottom surface with thicknesses, t, having different profiles. In other embodiments, the thickness, t, of the heat spreader is thinner on the outer top periphery on the top surface of the heat spreader. Material placed in these regions is less effective in heat transfer than material in other regions of the heat spreader.

Exemplary embodiments of the invention will now be discussed in further detail regarding semiconductor devices, structures, and methods of manufacturing and using these heat spreader devices and structures.

It is to be understood that embodiments of the invention are not limited to these illustrative methods, apparatus, systems and devices but instead are more broadly applicable to other alternative and broader methods, apparatus, systems and devices that become evident to those skilled in the art given this disclosure.

Certain elements may be left out of certain views for the sake of clarity and/or simplicity when explanations are not necessarily focused on such omitted elements. Moreover, the same or similar reference numbers used throughout the drawings are used to denote the same or similar features, elements, or structures, and thus, a detailed explanation of the same or similar features, elements, or structures will not be repeated for each of the drawings.

As used herein, "height" refers to a vertical size of an element (e.g., a layer, hole, opening, a place missing material, etc.) in the cross-sectional or elevation views measured from a bottom surface to a top surface of the element, a surface to a designated point, and/or measured with respect to a surface on which the element is located.

Conversely, a "depth" refers to a vertical size of an element (e.g., a layer, trench, hole, opening, a place missing material, etc.) in the cross-sectional or elevation views measured from a top surface to a bottom surface of the element. Terms such as "thick", "thickness", "thin" or derivatives thereof may be used in place of "height" where indicated.

As used herein, "lateral," "lateral side," and "lateral surface" refer to a side surface of an element (e.g., a layer, opening, etc.), such as a left or right-side surface in the drawings.

As used herein, "width" or "length" refers to a size of an element (e.g., a layer, trench, hole, opening, etc.) in the drawings measured from a side surface/edge to an opposite surface/edge of the element. Terms such as "thick", "thickness", "thin" or derivatives thereof may be used in place of "width" or "length" where indicated.

As used herein, terms such as "upper", "lower", "right", "left", "vertical", "horizontal", "top", "bottom", and derivatives thereof shall relate to the disclosed structures and methods, as oriented in the drawing figures. For example, as used herein, "vertical" refers to a direction perpendicular to the top surface of the substrate in the elevation views, and "horizontal" refers to a direction parallel to the top surface of the substrate in the elevation views.

As used herein, unless otherwise specified, terms such as "on", "overlying", "atop", "on top", "positioned on" or "positioned atop" mean that a first element is present on a second element, wherein intervening elements may be present between the first element and the second element. As used herein, unless otherwise specified, the term "directly" used in connection with the terms "on", "overlying", "atop", "on top", "positioned on" or "positioned atop," "disposed on," or the terms "in contact" or "direct contact" means that a first element and a second element are connected without any intervening elements, such as, for example, intermediary conducting, insulating or semiconductor layers, present between the first element and the second element.

It is understood that these terms might be affected by the orientation of the device described. For example, while the meaning of these descriptions might change if the device was rotated upside down, the descriptions remain valid because they describe relative relationships between features of the invention.

Refer to FIG. 1A, an elevation view of one preferred embodiment of the present heat spreader invention 100 used in a chip package 101.

FIG. 1A shows a semiconductor chip (or chips) 150, electrically connected through interconnects 110 to electric circuitry embedded in substrate 105. The heat spreader 100 is supported upon the substrate (or chip carrier) 105 on the heat spreader 100 lip 125. In preferred embodiments, the lip 125 can be attached to the substrate 105 by a seal band 126 that is an adhesive material between the lip 125 and the substrate 105.

One or more of the surfaces 151 of the chip 150 (typically the chip top surface 151) are thermally connected by a thermal interface material (TIM) 115 to the central bottom surface (or pedestal bottom) 130. The central region 190 of the heat spreader 100 that is the vertical projection (described below) of the central bottom surface 130 is where heat spreader 100 is thickest 131 (not accounting for the lip 125,) i.e., the maximum pedestal thickness 131. The transition bottom region 175 is between the central region 190 and the lip 125.

The heat spreader 100 has a top surface 185. The top surface 185 has a central top surface 140 that is flat and the vertical projection of the central bottom surface 130 through central region 190. The top surface 185 also has an outer top periphery 180 and a transition top region 160 between the central top surface 140 and the inner most edge 182 of the outer top periphery 180.

In preferred embodiments, thermal physical connections 115 are made with a thermally conductive material, and/or paste 115 well known in the art that may or may not be electrically conductive depending on the application. In preferred embodiments, the thermal conductive material is a thermal interface material (TIM.) The primary function of a TIM is to eliminate the air entrapped between the conjoined surfaces since air is a very poor thermal conductor, and to enhance the thermal conductance between the adjoining surfaces (e.g. 130 and 151.) Exemplary thermal interface materials include thermal greases, phase change materials, gels, adhesives, carbon nanotubes, as well as other novel materials. TIM may be a precured pad, or grease, or dispensed wet then cured in-situ. The curing may be achieved thermally or chemically.

FIG. 1B is a top view of the top surface 185 of the heat spreader in FIG. 1A showing in phantom view 150P of the chip top surface 151 with a chip top surface 151 of length, lc, and width, wc. The central top surface 140 is shown as the phantom vertical projection of the central bottom surface 130 through the central region 190. The central top surface is flat and has central top surface 140 dimensions of width 140$w$ or $wb$ and length 140$l$ or $lb$. In preferred embodiments, the central top surface 140 is larger than and surrounds the phantom view 150P and chip top surface 151. In preferred embodiments, a heat sink 250 is attached, e.g. with a TIM 115, to the top 185 of the heat spreader 100. The heat sink 250 is not shown in FIG. 1B for clarity.

Orthogonal cartesian directions are shown as the X, Y, and Z axes as reference directions to establish relative positional descriptions of the features of the invention and other components. As stated, these dimensions are non-limiting and for example reference only.

In preferred embodiments, the central top surface 140 has side widths (140w, wb) that are parallel to and a distance, Ew, away from the chip 150P sides wc. The central top surface also has side lengths (140l or lb) that are parallel to and a distance El away from chip 150P sides lc.

In preferred embodiments, the central top surface 140 has a width equal to the width of the chip, wc, plus an edge width, Ew, added to each side of the chip's 150P surface width wc projection and a length equal to the length of the chip lc plus an edge length, El, added to each side of the chip 150P surface length, lc, projection. In some embodiments, the central top surface 140 and the chip projection 150P are not aligned so that some or all of the added edge dimension extending the width and/or length of the central top surface 140 are not equal. In other embodiments, the edge widths (Ew, 130w) are equal, the edge lengths (El, 130l) are equal, or all the edge widths (Ew, 130w) and lengths (El, 130l) are equal.

The top 151 of the chip 150 is shown in phantom view 150P in FIG. 1B, as the chip 150 is thermally connected to the central bottom surface 130. The chip 150 has a width, wc, and a length, lc. The chip 150 does not have to be centered on the central bottom surface 130 but in preferred embodiments, the chip 150 is aligned to be centered horizontally (in the X-direction) and vertically (in the Y direction) with respect to the outside edges of the central bottom surface 130.

The top surface 185 of the heat spreader 100 is flat in preferred embodiments to enable good thermal contact with the heat sink 250. However, in some preferred embodiments, the top 185 of the heat spreader 100 may have less material particularly around the top edges 181 (typically) of the heat spreader 100, in the outer top periphery 180 in order to reduce the weight of the heat spreader.

Thus, in preferred embodiments, the top cap surface 185 can be seen with 3 different regions: 1. central top surface 140, 2. the outer top periphery 180 along one or more of the edges 181 of the heat spreader 100 and 3. a transition top region 160, the area on the top surface 185 that is between the central top surface 140 and the inner edge 182 of the outer top periphery 180.

In alternative embodiments, heat spreader thickness, t, is reduced at the outer top periphery 180 from either one side, two sides (opposite or adjacent sides), three sides, or all around the full perimeter of the heat spreader 100. The width of the outer top periphery 180 is the perpendicular distance, S, between the edges (181, 182) of the outer top periphery 180. The outer top periphery 180 of the heat spreader 100 is a region on top surface 185 where there is a step down 181 or reduced thickness from the surface 185 of the heat spreader 100. In preferred embodiments, to remove heat from the chip 150 in a symmetrical fashion, there is a reduced thickness in the outer top periphery 180 all around the full perimeter of the heat spreader 100 at a uniform distance, and at a common depth.

The transition bottom region 175 is under some or all of the transition top region 160. In preferred embodiments, the heat spreader 100 thickness 184, t, decreases in some fashion (described below) in the transition bottom region 175 as distance increases from the chip 150.

As a result, in some embodiments, the heat spreader 100 has a reduced thickness t 184 in both the transition top region 160, the outer top periphery 180, and/or the transition bottom region 175. For example, the thickness t 184 is reduced as the outer top periphery steps down below the top surface 185 at the same location 183 there is a reduced thickness in the transition bottom region 175.

FIG. 1C is a side cross-section view A-A 194 of the heat spreader 100 showing an example place where thicknesses, t, of the heat spreader 100 are reduced in a preferred embodiment. FIG. 1C shows a portion of the heat spreader 100 that is thinned 195 with no material above in the outer top periphery 180 and no material below in the transition cap bottom region 175.

In preferred embodiments, the transition bottom regions 175 and/or the outer top periphery 180 are regions of the heat spreader 100 that can have reduced amounts of material in order to reduce the weight of the heat spreader.

Figure 2:
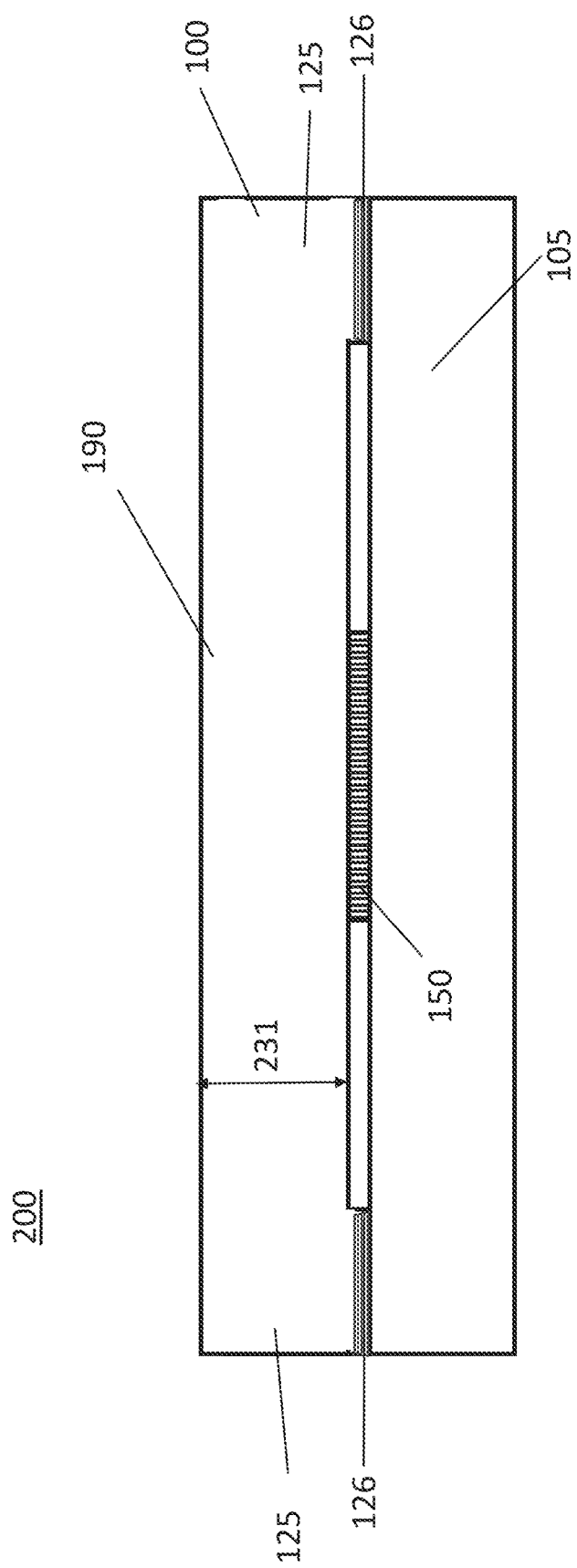
FIG. 2 is a structural drawing of one preferred embodiment of chosen as a base case heat spreader with uniform thickness used in one embodiment of the novel method of FIG. 8.

FIG. 2 is a structure drawing of one preferred embodiment of a base case heat spreader 200 being of uniform thickness (maximum pedestal thickness) 231 including in the transition bottom region 175 (not shown.) In a preferred embodiment the heat spreader 200 has a lip 125 that is physically connected to the substrate 105 through a seal band material 126. In one preferred embodiment, this heat spreader structure 200 will be used as a base case structure for comparison and application of criteria 815 during method 800. This structure 200 typically has high thermal transfer but has high mass as well.

Figure 3:
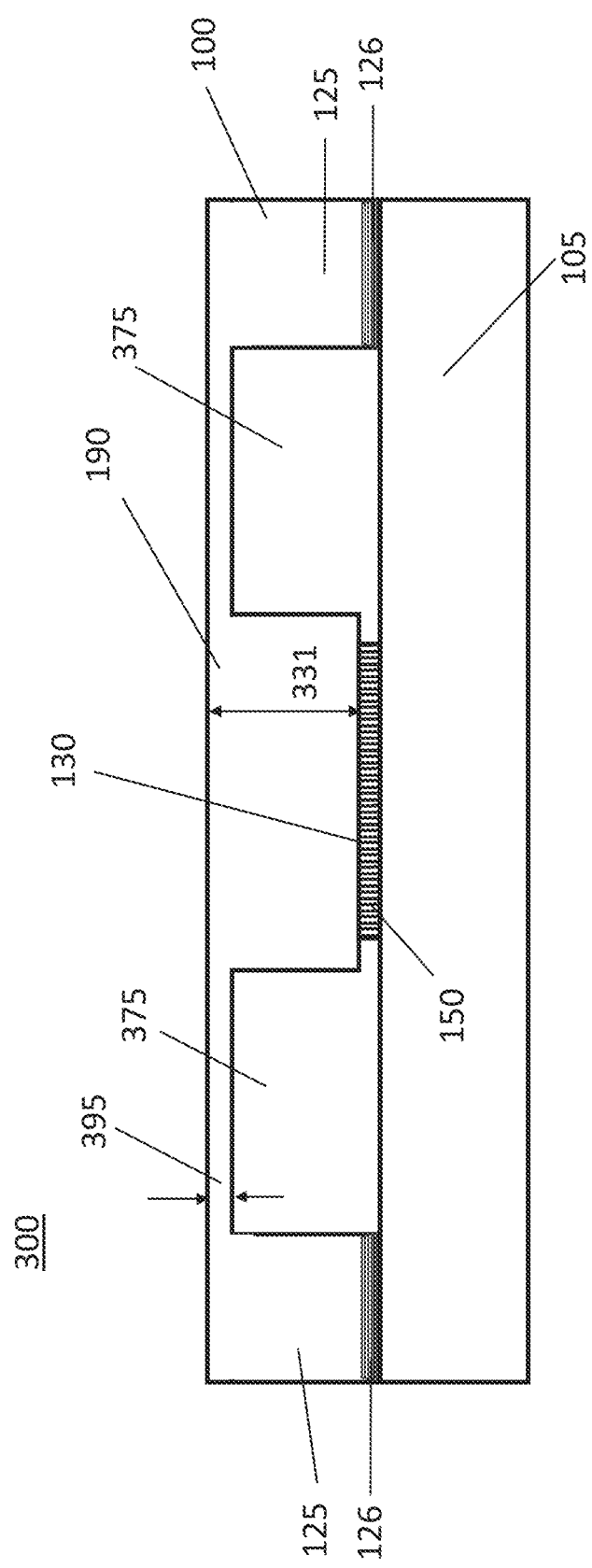
FIG. 3 is a structural drawing of one preferred embodiment of a heat spreader with i. a maximum pedestal thickness that is uniformly thick and above the central bottom surface and ii. a uniformly thin transition region.

FIG. 3 is a structural drawing of one preferred embodiment of a heat spreader 300 with a thin transition bottom region 375 of uniform thickness 395 and a thick central region 190 with a uniform thickness (maximum pedestal thickness) of 331 over the chip 150. The heat spreader 300 has a central region 190 over the chip 150 providing the central bottom surface 130. This heat spreader 300 has a low mass but less efficient heat transfer.

Figure 4:
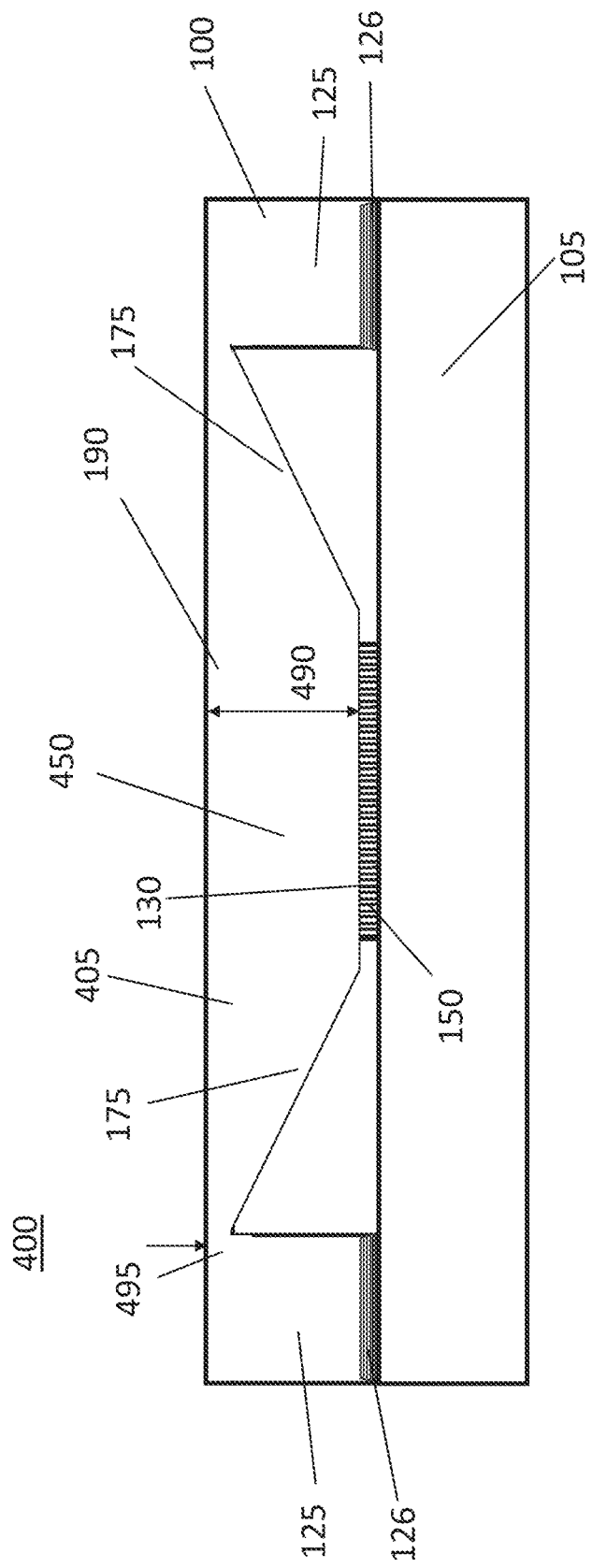
FIG. 4 is a structure drawing of one preferred embodiment of a heat spreader with i. a maximum pedestal thickness that is uniformly thick above the central bottom surface and ii. a linearly tapered transition region.

FIG. 4 is a structural drawing of one preferred embodiment of a heat spreader 400 with a pedestal 450 that provides the central bottom surface 130 over the chip 150. In the transition bottom regions 175 the pedestal 450 varies linearly in thickness from a thicker thickness (maximum pedestal thickness) 490 in the central bottom surface 130 and central region 190 to a thinner point 495 at the opposite side of the transition bottom regions 175. This embodiment 400 of the heat spreader 100 has high heat transfer but is lighter in weight.

Figure 5:
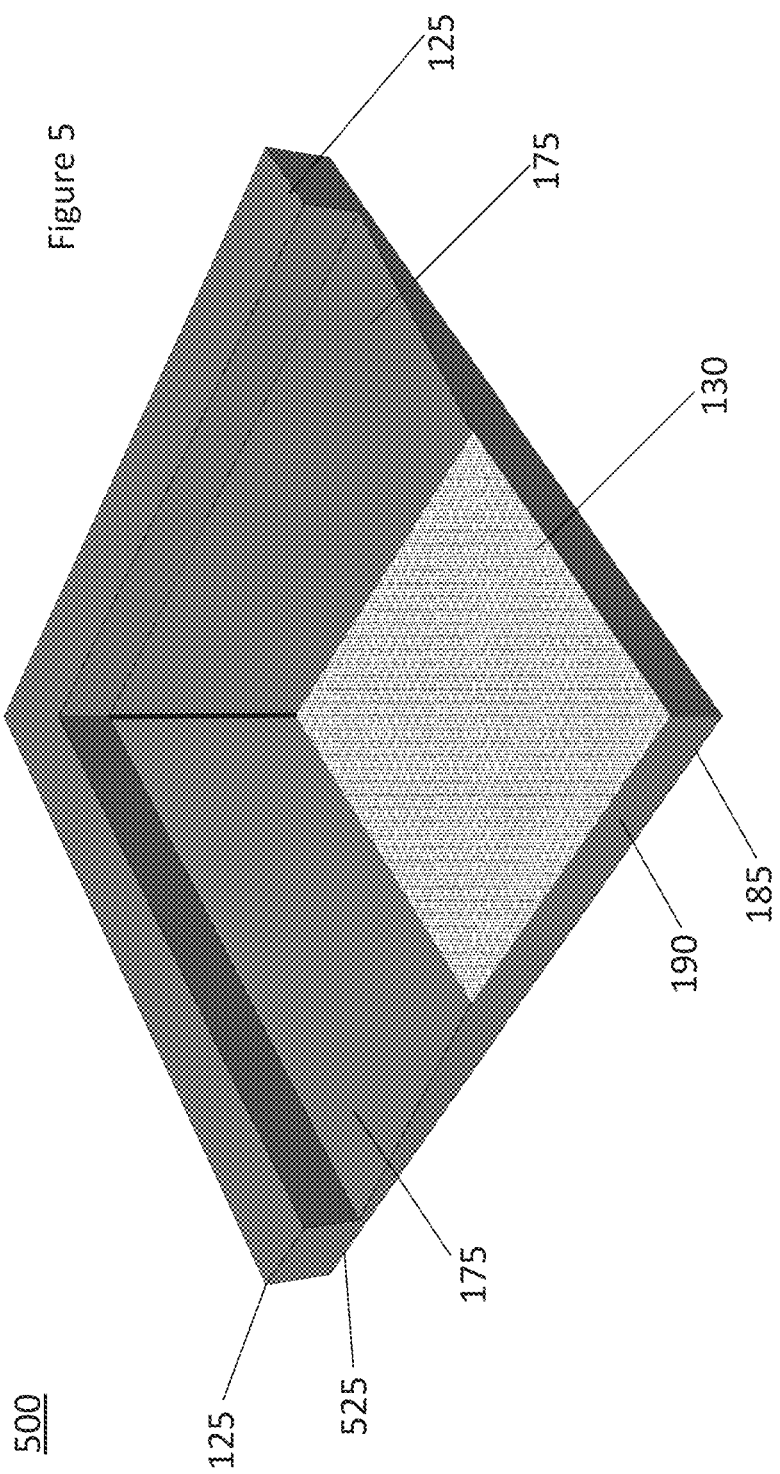
FIG. 5 is a partial isometric view of the bottom of one preferred example heat spreader like the one described in FIG. 4.

FIG. 5 is a partial isometric view of the bottom of one preferred example 500 like the heat spreader structure 400 described in FIG. 4. The structure 500 shows the central bottom surface 130, the transition bottom region 175, the central region 190, the top surface 185 (hidden), and the lip 125 in isometric view. This view shows a preferred embodiment with only ¼ of the heat spreader 500 which would have 3 more identical parts arranged so the lips 125 connect to form a square/rectangular enclosed volume. In one embodiment the lip 125 extends down and at least partially around a bottom surface periphery 525.

Figure 6:
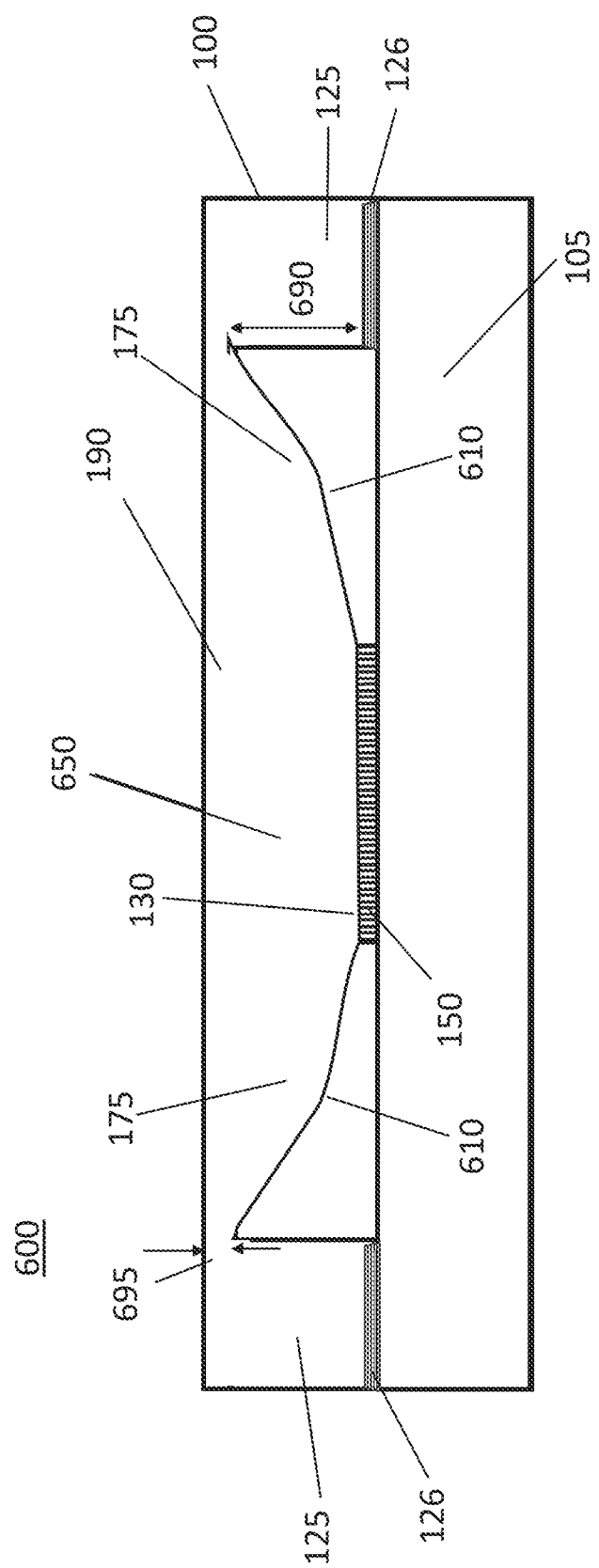
FIG. 6 is a structural drawing of one preferred embodiment of a heat spreader with i. a maximum pedestal thickness that is uniformly thick and ii. a curvi-linear, concave, tapered transition region.

FIG. 6 is a structure drawing of one preferred embodiment 600 of a heat spreader 100 with a pedestal 650 that provides the central bottom surface 130 over the chip 150. In the transition bottom regions 175 the pedestal 650 varies curvilinearly and convexly in thickness from a thicker thickness 690 at the central region 190 to a thinner point 695 at the opposite side of the transition bottom regions 175. The average thickness of the pedestal 650 is thicker than the average thickness of (linearly varying) pedestal 450 because the pedestal 650 has more material in convex regions 610. The shape of the profile of the thickness of pedestal 650 can be defined in any one or more of the following ways: a polynomial, a piece-wise linear function, a step function, etc.

Figure 7:
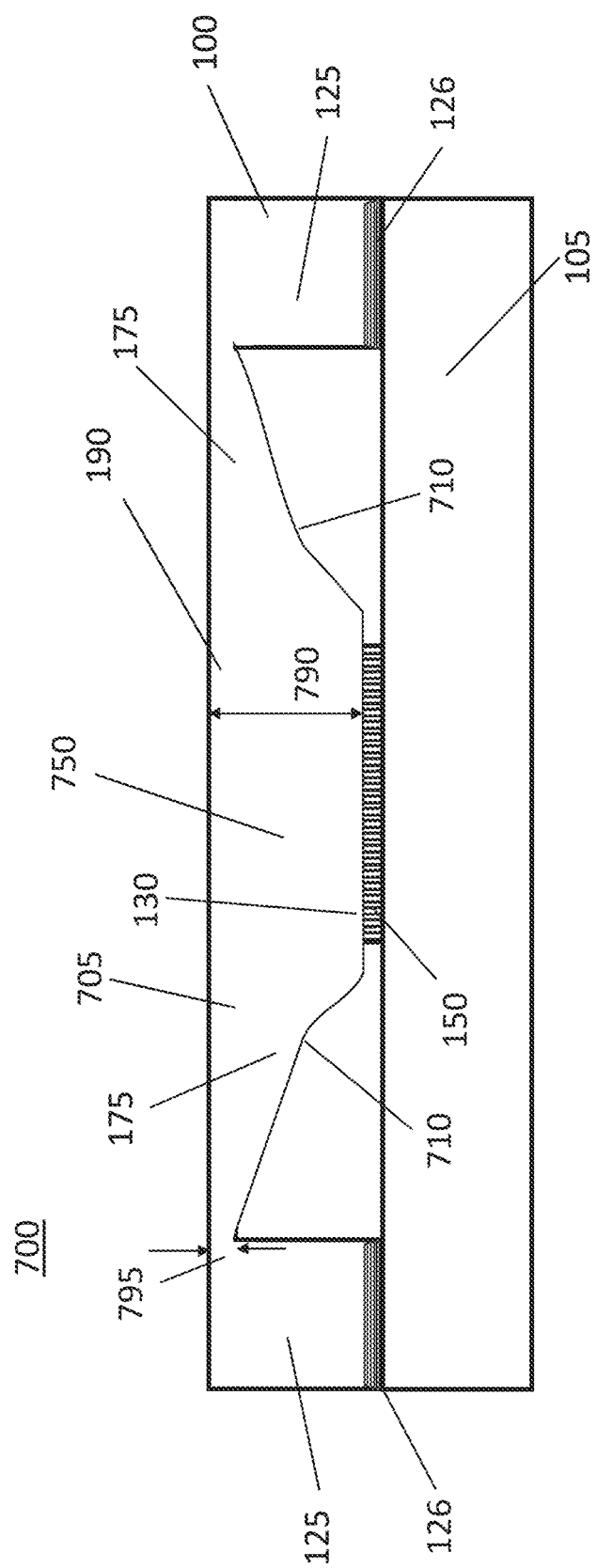
FIG. 7 is a structure drawing of one preferred embodiment of a heat spreader with i. a maximum pedestal thickness that is uniformly thick and ii. a curvi-linear, convex, tapered transition region.

FIG. 7 is a structure drawing of one preferred embodiment 700 of a heat spreader 100 with a pedestal 750 that provides the central bottom surface 130 over the chip 150. In the transition bottom regions 175 the pedestal 750 varies non-linearly in thickness from a thicker thickness 790 at the central bottom surface 130 and central region 190 to a thinner point 795 at the opposite side of the transition bottom cap regions 175. The average thickness of the pedestal 750 is thinner than the average thickness of (linearly varying) pedestal 450 because the pedestal 750 has less material in concave regions 710. The shape of the profile of the thickness of pedestal 750 can be defined in any one or more of the following ways: a polynomial, a piece-wise linear function, a step function, etc.

In preferred embodiments, the material the various embodiments of heat spreader 100 is made of are materials with good thermal conductivity. In some embodiments, the materials also provide support and stiffness for the chip 150 and the substrate 105. These materials with high thermal conductivity include but are not limited to metals, alloys, or composites such as copper, aluminum, AlSiC, SiC, and graphite.

Figure 8:
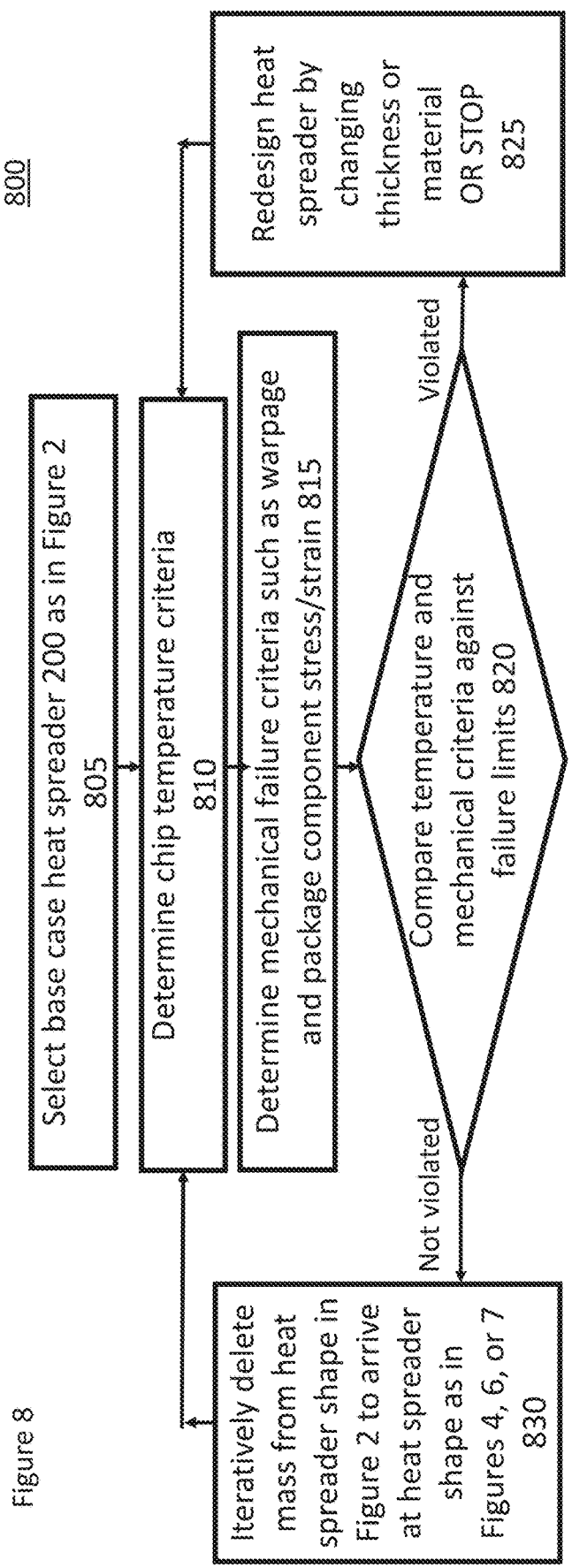
FIG. 8 is a flow chart of a method for determining the structure of a heat spreader with optimized weight and heat removal.

FIG. 8 is a flow chart of a method 800 for determining the structure and dimensions of a heat spreader with optimized weight and heat removal.

Step 805 begins method 800 by selecting a base case 805 heat spreader 200 in FIG. 2. The weight/mass of the chosen base case heat spreader 200 is determined in this step 805.

In step 810 the operating temperature of the chip 150 is determined by conducting a thermal analysis. The operating temperature may be a chip peak or chip average or other relevant package temperature. Cooling hardware for an electronic package is designed to keep the operating temperature below a certain limit such as 85 C.

In step 815 one or more criteria like mechanical constraints/criteria are determined. These criteria include but are not limited to a maximum chip carrier 105 warpage, a maximum lid 100 warpage, a maximum underfill 110 stress, maximum TIM (e.g. 115) strain, maximum seal band 126 stress, etc. These criteria are determined by applying a factor of safety to the failure limits of these materials. For example, the maximum seal band failure strength may be 500 psi or the maximum chip carrier warpage may be 200 um.

In step 820, the values of one or more of the parameters are compared to the respective criteria representing package component or material failure limits, e.g. a temperature constraint and/or a mechanical constraint.

If any of the criteria are violated as in step 825, the heat spreader is redesigned by changing the spreader dimensions or materials.

If none of the criteria are violated as in step 830, an iterative procedure is employed to delete mass from the heat spreader while meeting the temperature and mechanical criteria. The iterative procedure is further described in FIG. 9.

Figure 9:
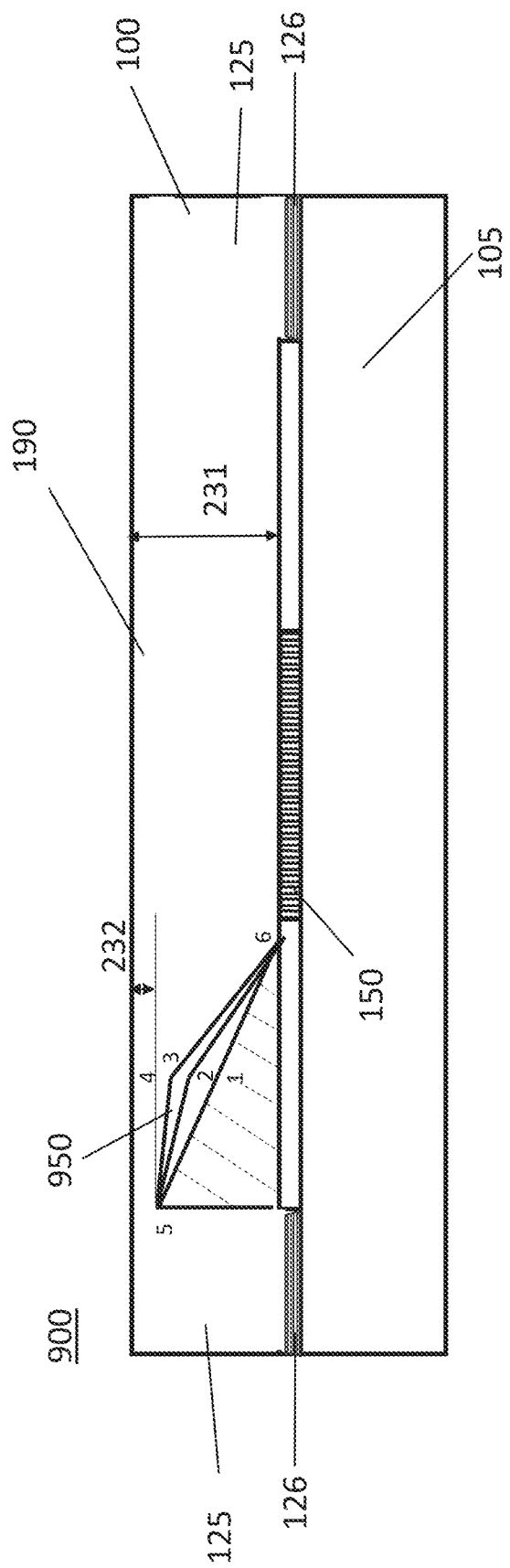
FIG. 9 shows the method of FIG. 8 operating on the base case of FIG. 2 as a non-limiting example iterating to remove mass at mid-points of repeatedly smaller segments progressing away from the pedestal.

FIG. 9 shows the method of FIG. 8 operating on the base case of FIG. 2 as a non-limiting example iterating to remove mass at mid-points of repeatedly smaller segments progressing away from the pedestal.

In FIG. 9, leaving a minimum percentage, say 10 or 20%, of the heat spreader thickness 232 aside, the mass is deleted at the center point 1 of the segment 5-6. If the temperature and mechanical criteria continue to be met, the remaining segment 1-4 is again bisected repeatedly to arrive at points 2 and 3 until say 10% of the segment 1-4 are left.

Figure 10:
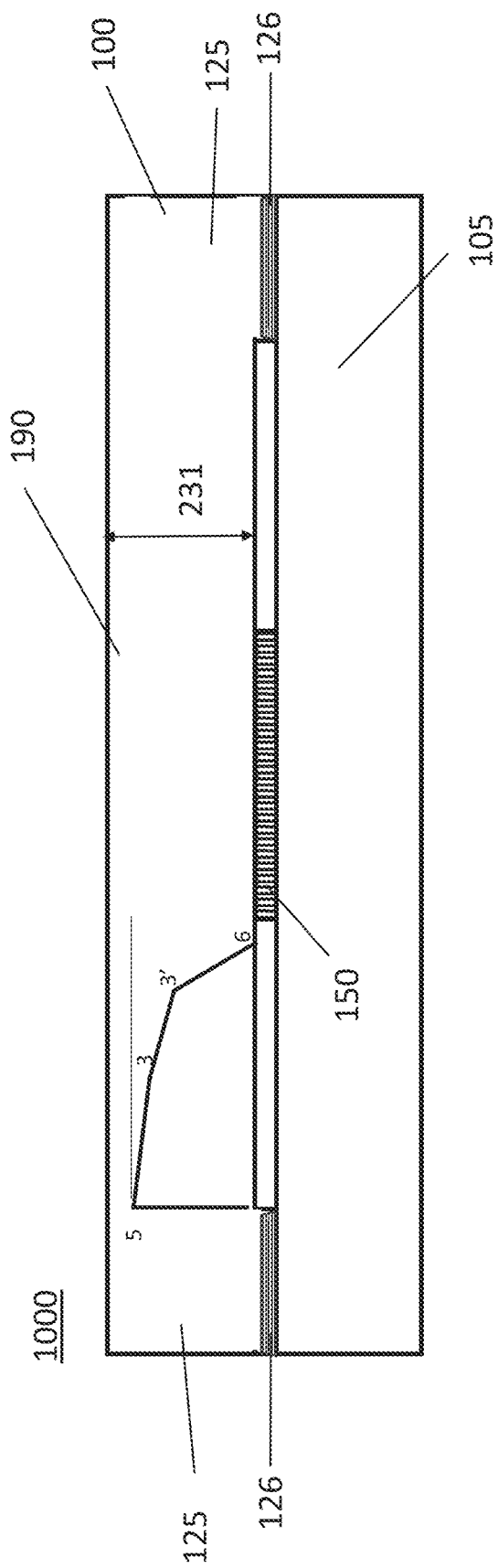
FIG. 10 shows the method of FIG. 8 operating on the resulting structure of FIG. 9 as a non-limiting example iterating to remove mass at mid-points of repeatedly smaller segments progressing toward the pedestal.

FIG. 10 shows the method of FIG. 8 operating on the resulting structure of FIG. 9 as a non-limiting example continuing to iterate to remove mass at mid-points of repeatedly smaller segments progressing toward the pedestal.

If the temperature and mechanical criteria continue to be met with segment 3-4, segment 3-6 is now modified to delete mass as shown in FIG. 10. Point 3' in FIG. 10 is arrived in the same method as points 1, 2 and 3 were arrived at in FIG. 9. In the extreme case, the procedure will terminate on reaching the shape 300 in FIG. 3.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

We claim:

1. A heat spreader comprising:
a top surface, the top surface comprising a central top surface, an outer top periphery, and a transition top region, the outer top periphery having one or more inner most edges and a width, S, the width being the perpendicular distance between one of the one or more of the outer top periphery and a top edge of the heat spreader, the transition top region being between the central top surface and the one or more of the outer top periphery;
a bottom surface, the bottom surface comprising a central bottom surface, a transition bottom region, and a lip extending down from and at least partially around a bottom surface periphery, a maximum pedestal thickness being in a central region between the central bottom surface and the central top surface and a thickness between the transition bottom region and the top surface, the thickness being thinner than the maximum pedestal thickness and the transition bottom region being between the central region and the lip,
wherein the top surface in the outer top periphery steps down below the top surface of the transition top region to reduce the thickness in the outer top periphery at the same location there is reduced thickness in the transition bottom region.

2. The heat spreader, as in claim 1, wherein the central top surface and central bottom surface are flat.

3. The heat spreader, as in claim 1, wherein the thickness decreases convexly.

4. The heat spreader, as in claim 1, wherein the thickness decreases concavely.

5. The heat spreader, as in claim 1, further comprising a semiconductor chip, the semiconductor chip having a chip top surface and the semiconductor chip being placed within a space created between the central bottom surface and a carrier surface of a carrier attached to the lip, wherein the chip top surface is connected to the central bottom surface of the heat spreader though a thermal interface material.

6. The heat spreader, as in claim 5, wherein the central bottom surface overlaps the chip top surface.

7. The heat spreader, as in claim 1, wherein the outer top periphery has a vertical projection that partially overlaps the transition bottom region.

8. The heat spreader, as in claim 1, made of one or more of the following materials: —a metal, an alloy, a composite copper, aluminum, AlSiC, SiC, and graphite.

9. The heat spreader, as in claim 1, wherein the lip is extending down from and fully around the bottom surface periphery.

10. The heat spreader, as in claim 9, wherein the lip forms an enclosed volume.

11. The heat spreader, as in claim 10, wherein the enclosed volume has a rectangular shape.

12. A heat removal system rising:
a chip carrier;
one or more semiconductor chips, each semiconductor chip having a chip top surface;
one or more heat spreaders each heat spreader comprising:
a top surface, the top surface comprising a central top surface, an outer top periphery, and a transition top region, the outer top periphery having one or more inner most edges and a width, S, the width being the perpendicular distance between one of the one or more of the outer top periphery and an outer top edge of the heat spreader, the transition top region being between the central top surface and the one or more of the outer top periphery;
a bottom surface, the bottom surface comprising a central bottom surface, a transition bottom region, and a lip extending down from and around a bottom surface periphery, a maximum pedestal thickness being in a central region between the central bottom surface and the central top surface and a thickness between the transition bottom region and the top surface, the thickness being thinner than the maximum pedestal thickness and the transition bottom region being between the central region and the lip,
wherein the top surface in the outer top periphery steps down below the top surface of the transition top region to reduce the thickness of the top surface in the outer top periphery and there is reduced thickness between both the outer top periphery and the transition bottom region at the same location where the outer top periphery has a vertical projection that partially overlaps the transition bottom region, and
wherein the lip is attached to a carrier surface of the chip carrier to create a space between the central bottom surface and the carrier surface.

13. The heat removal system, as in claim 12, where the lip is connected to the carrier surface by a seal band adhesive.

14. The heat removal system, as in claim 12, where the semiconductor chip is thermally connected to the central bottom surface by imposing a heat conductive sealer between the chip top surface and the central bottom surface.

15. The heat removal system, as in claim 12, further comprising a heat sink thermally connected to the central top surface by interposing a heat conductive sealer between the heat sink and the central top surface.

* * * * *